United States Patent [19]
Choi

[11] Patent Number: 6,013,109
[45] Date of Patent: Jan. 11, 2000

[54] CRACK-RESISTANCE SEMICONDUCTOR PACKAGE AND FABRICATION METHOD THEREOF AND FABRICATION APPARATUS THEREOF

[75] Inventor: Sihn Choi, Choongcheongbuk-Do, Rep. of Korea

[73] Assignee: LG Semicon Co., Ltd., Cheongju, Rep. of Korea

[21] Appl. No.: 08/901,628

[22] Filed: Jul. 28, 1997

[30] Foreign Application Priority Data

Jul. 30, 1996 [KR] Rep. of Korea ............. 96/34420

[51] Int. Cl.⁷ .................................................. H01L 21/44
[52] U.S. Cl. ......................................... 938/124; 438/127
[58] Field of Search ................................. 438/112, 123, 438/124, 126, 127

[56] References Cited

U.S. PATENT DOCUMENTS

| | | | |
|---|---|---|---|
| 4,486,945 | 12/1984 | Aigoo | 438/124 |
| 4,821,148 | 4/1989 | Kobayashi et al. | 438/124 |
| 5,013,688 | 5/1991 | Yamazaki et al. | 438/124 |
| 5,096,851 | 3/1992 | Yamazaki et al. | 438/127 |
| 5,208,467 | 5/1993 | Yamazaki et al. | 257/667 |
| 5,310,702 | 5/1994 | Yoshida et al. | 438/127 |
| 5,434,106 | 7/1995 | Lim et al. | |
| 5,438,222 | 8/1995 | Yamazaki | 257/673 |
| 5,527,742 | 6/1996 | Weiler et al. | 438/124 |

*Primary Examiner*—Kevin M. Picardat
*Attorney, Agent, or Firm*—Fleshner & Kim

[57] ABSTRACT

A crack-resistant fabrication method and fabrication apparatus for a semiconductor package prevents interface isolation and cracks by coating a semiconductor chip disposed in a semiconductor package, a paddle of a lead frame, bonding wires and a bond paste using a polyimide type coating material. The coating material forms a coating film to act as a buffering member. The fabrication method can include the steps of attaching a semiconductor chip on a paddle, electrically coupling the semiconductor chip and leads, forming a coating film on the surfaces of the semiconductor chip and the leads, and molding the semiconductor chip, the leads, and the coating film.

15 Claims, 3 Drawing Sheets

CRACK-RESISTANCE SEMICONDUCTOR PACKAGE AND FABRICATION METHOD THEREOF AND FABRICATION APPARATUS THEREOF

BACKGROUND OF THE INVENTION

1. Field of the Invention

The present invention relates to a fabrication method, a fabrication apparatus and a semiconductor package that prevents cracks in the semiconductor package, and in particular, that prevents interface delamination and cracking by performing a coating process.

2. Background of the Related Art

As shown in FIG. 1, one type of related art semiconductor package includes a semiconductor chip 1 fixed to a paddle 2 of a lead frame by an adhesive 3. The pads (not shown) of the semiconductor chip 1 are electrically connected to inner leads 4a of the lead frame by wires 5. Then, the above-described elements are sealingly encapsulated by a molding resin 6, and the outer leads 4b are formed to a desired shape.

In the related art "lead-on-chip" (LOC) package as shown in FIG. 2, inner leads 13a are directly attached to the upper side of the semiconductor chip 11 by a double-sided adhesive insulation tape 12. The inner leads are electrically connected to chip pads (not shown) formed at the center of the semiconductor chip 11 by wires 14. The chip 11, inner leads 13a and wires 14 are encapsulated by molding resin 15. Then, the outer leads 13b are formed into a desired shape according to the requirements of an end user.

However, the above-described semiconductor packages have disadvantages in that an interface isolation and a cracking phenomenon can occur because of a thermal expansion coefficient mismatch between the different materials at the interface between the chip 1 and the paddle 2, at the interface between the paddle 2 and the the molding resin 6, at the interface between the chip 1 and the molding resin 6 and at the interface between the chip 11 and the molding resin 15. In addition, such interface isolation and cracks increase with the duration of the fabrication processes, which increasingly degrades the reliability of the device.

To overcome the above problems, many studies have been conducted. One method of enhancing the strength and adhesive property of the molding resin sealing material was introduced in the industry. In addition, according to U.S. Pat. Ser. No. 5,434,106, a method of coating an aminopropyltriethoxysilane film on an inactive surface of the semiconductor chip (i.e., an area without circuitry) has been introduced.

However, there is a limit in increasing the strength of the molding resin. In addition, as the hardness is increased, the molding resin can be more easily broken. Further, in the case of increasing the adhesive property of the molding resin, proper ejecting and cleaning of the molded package becomes very difficult and many flashes can occur, and the adhesive property of the flashes is increased. Thus, deflashing becomes more difficult.

In addition, the method of coating the lower portion of the semiconductor chip of the LOC type package in U.S. Pat. No. 5,434,106 is limited to only one surface in which the prevention region of the interface isolation/crack is coated on the semiconductor chip. Therefore, the effects are minimized. In addition, after the back grinding process is performed in a wafer state, the coating process has to be performed again, which complicates the fabrication process.

The above references are incorporated by reference herein where appropriate for appropriate teachings of additional or alternative details, features and/or technical background.

SUMMARY OF THE INVENTION

An object of the present invention is to substantially obviate one or more of the problems caused by limitations and disadvantages of the related art.

It is another object of the present invention to provide a semiconductor package that resists cracking and a fabrication method and fabrication apparatus thereof.

It is yet another object of the present invention to provide a semiconductor package that resists cracking and a fabrication method and fabrication apparatus thereof to prevent interface isolation and cracking by coating a chip disposed in a semiconductor package, a paddle of a lead frame, a wire and a bond paste using a polyimide type coating material, which acts as a buffering member.

To achieve at least the above objects in whole or in part, there is provided a semiconductor package fabrication method for preventing cracking that includes attaching a semiconductor chip onto a pad, electrically coupling the semiconductor chip and leads, forming a coating film on the surfaces of the semiconductor chip and the leads, and molding the semiconductor chip, the leads, and the coating film. Further, a semiconductor package fabrication apparatus for preventing cracking includes a heating member for radiating heat, a moving member for moving the heating member, and a control member for controlling the On/Off operation of the heating member and the movement of the moving member.

To achieve at least the above objects in whole or in part, there is provided a crack-resistant semiconductor package, including a semiconductor chip, leads for transferring an electrical signal outside the semiconductor package, conductive wires that electrically couple the semiconductor chip and the leads, a coating film formed at least on surfaces of the semiconductor chip and the leads and a molding resin that packages the semiconductor chip, the wires and the coating film.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Figure 1:
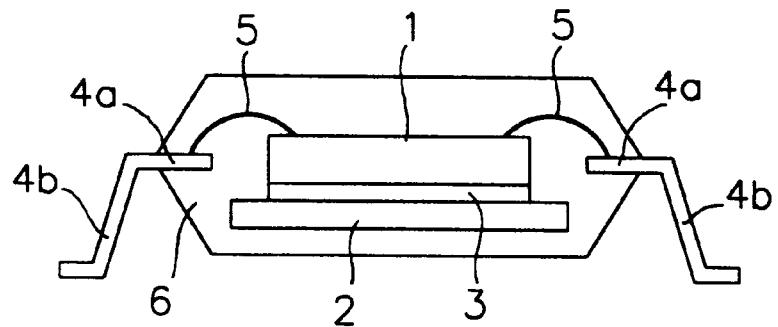
FIG. 1 is a cross-sectional diagram showing a related art semiconductor package.
Figure 2:
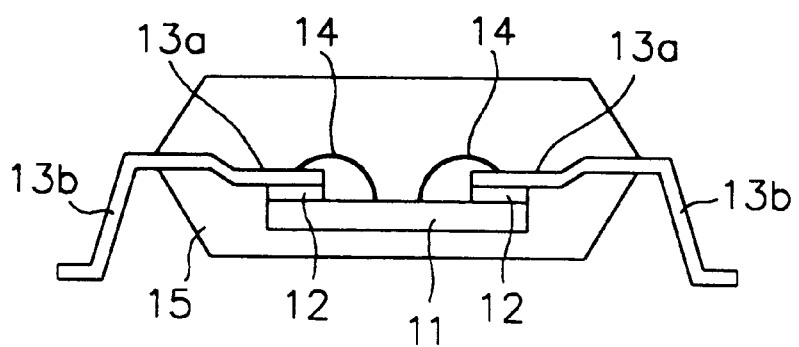
FIG. 2 is a cross-sectional diagram showing a related art lead-on-chip (LOC) type semiconductor package.
Figure 3A:
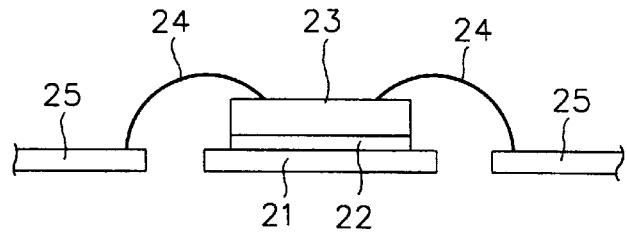
FIGS. 3A–3D are cross-sectional diagrams showing a preferred embodiment of a fabrication method of a semiconductor package according to the present invention.

A preferred embodiment of a fabrication method of a crack-resistant semiconductor package according to the present invention will be explained with reference to FIGS. 3A–3D. As shown in FIG. 3A, a semiconductor chip 23 is attached using adhesive 22 to the upper surface of a paddle 21 of a lead frame, and the semiconductor chip 23 and inner leads 25 are electrically coupled using conductive wires 24.

Figure 3B:
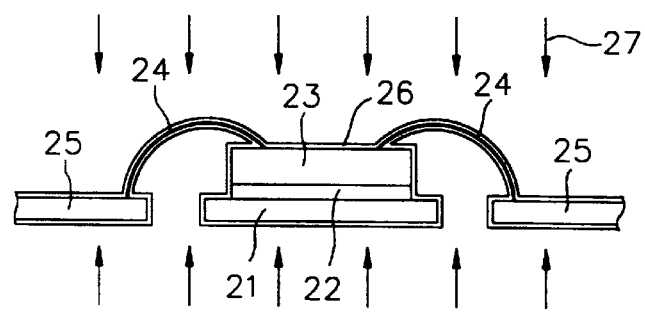
Figure 3C:
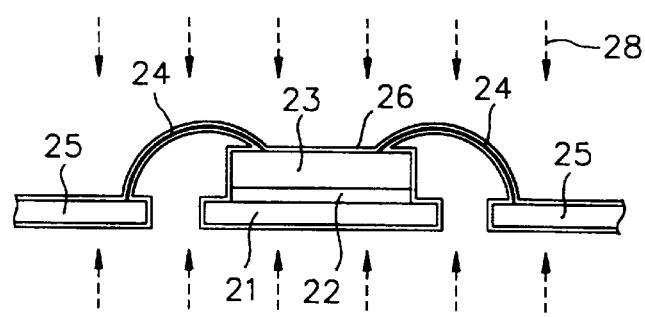

As shown in FIG. 3B, a coating liquid 27, which is preferably a polyimide precursor that incorporates a self-adhesion promoter type material, is sprayed over the entire surfaces of the semiconductor chip 23, the paddle 21 of the lead frame, the inner leads 25, and the wires 24. In this manner, a liquid coating film 26 of a low density is coated on the surfaces of the semiconductor chip 23, the paddle 21, the inner leads 25 and the wires 24. As shown in FIG. 3C, the coating film 26 formed in the coating process is then hardened. The hardening process preferably uses an infrared lamp to harden the coating film 26 under radiation heat 28 of the infrared rays.

Figure 3D:
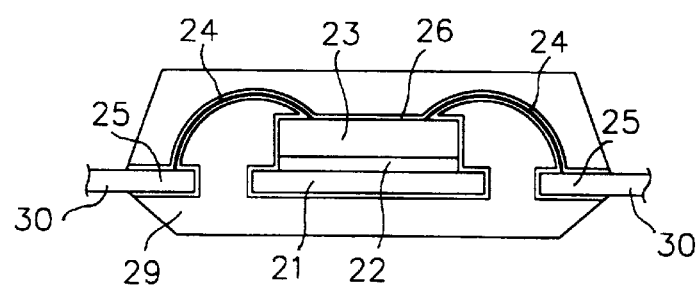

After the hardening process is finished, as shown in FIG. 3D, the semiconductor chip 23, the paddle 21, the inner leads 25, and the wires 24 are sealingly encapsulated by a molding resin 29 to form a desired shaped body. Thereafter, a semiconductor package can be fabricated through a trimming process to trim unnecessary portions. Further, the semiconductor package can be fabricated through a forming process to shape outer leads 30.

In the coating process, the thickness of the coating film 26 is preferably 2–30μm and the viscosity of the coating liquid 27 is 10–20 poise. In the hardening process the hardening temperature is preferably 300–450° C. and the hardening time is 40–120 seconds. In addition, the infrared lamp of the hardening apparatus used for the hardening process is preferably movable upwards, downwards, forwards, backwards and horizontally. The infrared lamp is disposed where the temperature in the heating zone endures a maximum of 500° C. with the maximum distance between the coated portion and the infrared lamp.

In addition, the formation of the coating film 26 of the preferred embodiment is not intended to be limited to the method of spraying the coating liquid 27. For example, a method of dipping the coating film 26 in a container in which the coating liquid 27 is contained or a method of depositing the coating liquid 27 or the like can also be used. Further, the coating film 26 is not intended to be limited to a polyimide precursor incorporating the self-adhesion promoter. For example, a polyimide, an epoxy or PTFE material such as Teflon (™) can also be used.

The semiconductor package fabricated according to the preferred semiconductor package fabrication method, as shown in FIG. 3D, includes the paddle 21, the semiconductor chip 23 attached on the paddle 21, the leads 25 for transferring electrical signals to and from the outside, the conductive wires 24 for electrically coupling the semiconductor chip 23 and the leads 25, the coating film 26 on the surfaces of the semiconductor chip 23, the leads 25, and the wires 24, and the molding resin 29.

Next, preferred embodiments of fabrication apparatus of the semiconductor package according to the present invention will be described with reference to FIGS. 4–5.

Figure 4:
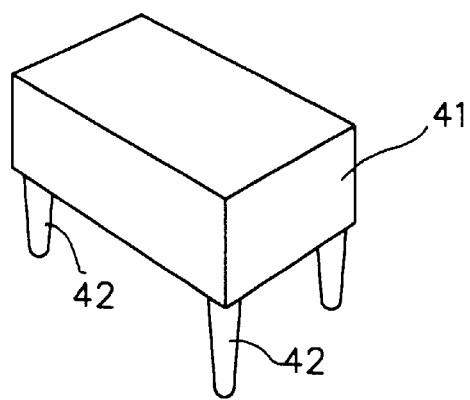
FIG. 4 is a perspective diagram showing a preferred embodiment of a coating apparatus for a semiconductor package according to the present invention.

As shown in FIG. 4, a coating apparatus among the fabrication apparatuses of the semiconductor package includes a pressure container 41 for storing a liquid-state coating material and for maintaining a constant pressure for the application spraying of the coating material. The coating apparatus further includes a plurality of spray members 42 communicating with the pressure container 41.

Figure 5:
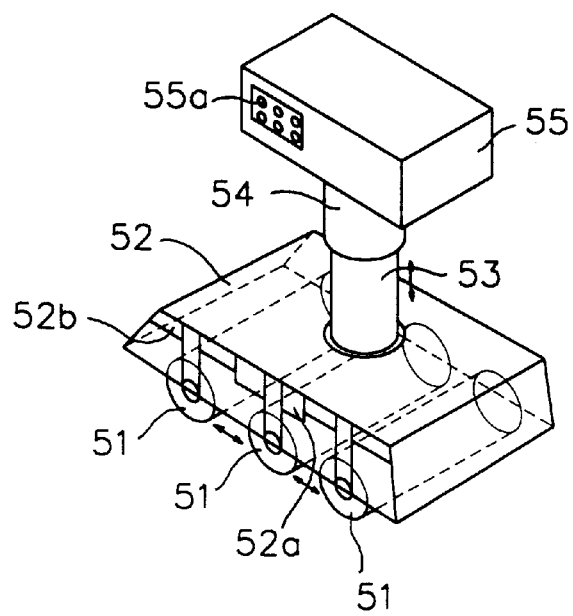
FIG. 5 is a perspective diagram showing a preferred embodiment of a hardening apparatus for a semiconductor package according to the present invention.

As shown in FIG. 5, a hardening apparatus among the fabrication apparatuses of the semiconductor package includes a plurality of infrared ray lamps 51. The infrared lamps 51 are disposed in a lamp body 52. The infrared lamps 51 and the lamp body 52 form a heating member that radiates infrared ray radiation heat.

The lamp body 52 is preferably cap-shaped to support the lamps 51. When the lamps 51 are turned on, the resulting light and heat are focused and transferred in a predetermined direction by the cap-shaped lamp body 52. The lamp body 52 includes a lamp casing 52a for receiving the lamps 51 and a guide rail 52b for guiding the casing 52a in a predetermined direction indicated by the bidirectional arrow "↔" in FIG. 5.

One end of a moving shaft 53 that moves vertically relative to the lamp body 52 is fixed to an upper surface of the lamp body 52. The other end of the moving shaft 53 is inserted into one end of a fixing shaft 54. The moving shaft 53 moves telescopically toward the inner portion of the fixing shaft 54. The other end of the fixing shaft 54 is fixed to a control member 55.

The moving shaft 53 and the fixed shaft 54 form a moving member that moves the heating member in a predetermined direction indicated by the bidirectional arrow "↕" in FIG. 5 based on a control signal of the control member 55.

The control member 55 is electrically coupled to the lamp casing 52a and controls the On/Off operation of the lamps 51, the movement of the lamp casing 52a and the movement of the moving shaft 53. A signal input unit 55a is disposed in the control member 55 for inputting command signals, for example, a movement command signal for the moving shaft 53, the lamp casing 52a or an On/Off command signal of the lamps 51.

Operations of the preferred embodiments of the fabrication method and fabrication apparatus of the semiconductor package according to the present invention will now be described.

First, the semiconductor chip 23 is secured on the paddle 21 of the lead frame using the adhesive 22. The semiconductor chip 23 and the inner leads 25 are bonded by the wires 24 and are transferred to the coating process region. In the coating process region, the coating apparatus having the pressure container 41 and the spray member 42, for example, is disposed. The coating liquid 27 stored in the pressure container 41 is sprayed on the surfaces the semiconductor chip 23, the paddle 21, the wires 24, and the inner leads 25 through the spray members 42 to form the coating film 26.

The thus coated assembly is transferred to the hardening process region. In the hardening process region the distance between the lamp 51 and the coating film 26 is adjusted to control the heating amount applied to the coating film 26. The hardening apparatus is also adjustable to control the temperature of the infrared rays applied to the coating film 26 to be a maximum of 500° C. by controlling the position of the moving shaft 53 with the control member 55. At this time, the position of the lamp casing 52a is also controlled to evenly apply the heat of the infrared rays generated by the lamps 51 to the coating film 26.

A reason to limit the temperature of the heat applied to the coating film 26 to the maximum of 500° C. is that the peak temperature during the chip attaching process is about 400° C. because of the characteristics of the materials involved. Further, the temperature during the wire bonding process is about 250° C. Accordingly, during the hardening process of the coating film 26, if a temperature greater than about 500° C. is applied to the semiconductor chip 23 or the adhesive 22, defects of the device can occur because of deformation of the materials from the high temperature. However, if the temperature of the heat applied to the coating film 26 is too low, it is impossible to properly perform the hardening process because of physical characteristics of the coating material.

As described above, the preferred embodiments of present invention are directed to forming a coating film by spraying the coating liquid, which is made of a polyimide type material, on the surfaces of the semiconductor chip, the paddle of the lead frame, the wires, and the adhesive after performing the wire bonding process. The coating film serves as a physical and thermal buffer and absorbs the stress causing interface isolation and crack formation because of the thermal expansion difference between the materials of the elements disposed in the package. Thus, the reliability of the semiconductor package is improved.

It is to be understood that both the foregoing general description and the following detailed description are exemplary and explanatory. It will be apparent to those skilled in the art that various modifications can be made in the fabrication method, fabrication apparatus and semiconductor package of the present invention without departing from the spirit or scope of the invention. It is intended that the present invention cover the modifications and variations of this invention that are within the scope of the appended claims and their equivalents.

What is claimed is:

1. A method for fabricating a crack-resistant semiconductor package, comprising:

attaching a semiconductor chip to a paddle of a lead frame;

electrically coupling the semiconductor chip and inner leads of the lead frame;

forming a coating film on surfaces of the semiconductor chip and the inner leads; and molding the semiconductor chip, the leads, and the coating film in a package, wherein the package has a first coefficient of thermal expansion and a least one of the semiconductor chip and the lead frame has a second coefficient of thermal expansion not equal to the first coefficient of thermal expansion, wherein the coating film buffers interfaces between the package and the semiconductor chip and the coating film buffers interfaces between the package and the lead frame, and wherein the coating film reduces cracking at the interfaces caused by the unequal first and second coefficients of thermal expansion.

2. The method of claim 1, wherein the forming a coating film comprises spraying a coating liquid.

3. The method of claim 2, wherein the viscosity of said coating liquid is 5–20 poise.

4. The method of claim 2, wherein the forming a coating film further comprises hardening the sprayed coating liquid.

5. The method of claim 4, wherein said hardening comprises heating the sprayed coating liquid.

6. The method of claim 5, wherein said heating uses infrared rays.

7. The method of claim 4, wherein the hardening uses a temperature range between 100–500° C.

8. The method of claim 4, wherein the hardening is performed for 5–180 seconds.

9. The method of claim 1, wherein the forming a coating film comprises dipping the semiconductor chip and the inner leads into a coating liquid.

10. The method of claim 9, wherein the viscosity of said coating liquid is 5–20 poise.

11. The method of claim 1, wherein the forming a coating film comprises a deposition process.

12. The method of claim 1, wherein said coating film is a polyimide type material.

13. The method of claim 12, wherein said polyimide type material includes a self-adhesion promoter type material.

14. The method of claim 1, wherein the forming a coating film is performed after the semiconductor chip is attached to the paddle of the lead frame.

15. A method for fabricating a crack-resistant semiconductor package, comprising:

attaching a semiconductor chip having a first coefficient of thermal expansion to a paddle of a lead frame having a second coefficient of thermal expansion;

electrically coupling the semiconductor chip and inner leads of the lead frame;

depositing a coating film on surfaces of the semiconductor chip and the inner leads;

hardening the coating film on the surface of the semiconductor chip and the inner leads; and molding the semiconductor chip, the leads, and the coating film in a package, wherein the package has a third coefficient of thermal expansion, wherein the first, second and third coefficients of thermal expansion are not equal, and wherein the coating film thermally buffers interfaces between the package and the semiconductor chip and the coating film thermally buffers interfaces between the package and the lead frame, and wherein the coating film reduces cracking at the interfaces caused by the unequal first, second and third coefficients of thermal expansion.

* * * * *

UNITED STATES PATENT AND TRADEMARK OFFICE
CERTIFICATE OF CORRECTION

PATENT NO : 6,013,109
DATED    : Jan. 11, 2000
INVENTOR(S): Choi

It is certified that error appears in the above-identified patent and that said Letters Patent is hereby corrected as shown below: On the title page: Item [54] and Column 1, line 1, change "RESISTANCE" to --RESISTANT--

[30] Foreign Application Priority Data

Change "96/34420" to --96/31420--

Signed and Sealed this

Seventh Day of November, 2000

Attest:

Q. TODD DICKINSON

Attesting Officer          Director of Patents and Trademarks